United States Patent
Park et al.

(10) Patent No.: US 8,906,791 B2
(45) Date of Patent: Dec. 9, 2014

(54) METHOD OF IMPROVING FILM NON-UNIFORMITY AND THROUGHPUT

(75) Inventors: Kie-Jin Park, San Jose, CA (US); Karl Leeser, San Jose, CA (US); Frank Greer, Pasadena, CA (US); David Cohen, San Jose, CA (US)

(73) Assignee: Novellus Systems, Inc., Fremont, CA (US)

( * ) Notice: Subject to any disclaimer, the term of this patent is extended or adjusted under 35 U.S.C. 154(b) by 366 days.

(21) Appl. No.: 13/152,588

(22) Filed: Jun. 3, 2011

(65) Prior Publication Data
US 2011/0300716 A1   Dec. 8, 2011

Related U.S. Application Data

(60) Provisional application No. 61/351,058, filed on Jun. 3, 2010.

(51) Int. Cl.
| | | |
|---|---|---|
| *H01L 21/38* | (2006.01) | |
| *H01L 23/02* | (2006.01) | |
| *C23C 16/455* | (2006.01) | |
| *H01J 37/32* | (2006.01) | |
| *C23C 16/36* | (2006.01) | |

(52) U.S. Cl.
CPC ..... *C23C 16/45565* (2013.01); *C23C 16/45531* (2013.01); *H01J 37/32449* (2013.01); *C23C 16/36* (2013.01); *H01J 37/3244* (2013.01)
USPC ........... 438/565; 438/584; 438/680; 427/457; 427/497; 118/715; 118/723 VE

(58) Field of Classification Search
USPC .................. 427/457, 497, 517, 569; 118/715, 118/723 VE, 723 MP; 438/513, 584, 565, 438/680
See application file for complete search history.

(56) References Cited

U.S. PATENT DOCUMENTS

| | | | |
|---|---|---|---|
| 6,045,877 | A | 4/2000 | Gleason et al. |
| 6,416,822 | B1 | 7/2002 | Chiang et al. |
| 6,428,859 | B1 | 8/2002 | Chiang et al. |

(Continued)

FOREIGN PATENT DOCUMENTS

JP         2009-152345        7/2009

OTHER PUBLICATIONS

International Search Report and Written Opinion mailed Feb. 9, 2012, issued in application No. PCT/US2011/039046.

(Continued)

*Primary Examiner* — Hsien Ming Lee
(74) *Attorney, Agent, or Firm* — Weaver Austin Villeneuve & Sampson, LLP

(57) ABSTRACT

Methods, apparatus, and systems for depositing materials with gaseous precursors are provided. In certain implementations, the methods involve providing a wafer substrate to a chamber of an apparatus. The apparatus includes a showerhead to deliver a gas to the chamber, a volume, and an isolation valve between the volume and the showerhead. A gas is delivered the volume when the isolation valve is closed, pressurizing the volume. The isolation valve is opened to allow the gas to flow to the showerhead when the gas is being delivered to the volume. A material is formed on the wafer substrate using the gas. In some implementations, releasing the pressurized gas from the volume reduces the duration of time to develop a spatially uniform gas flow across the showerhead.

19 Claims, 10 Drawing Sheets

(56) References Cited

U.S. PATENT DOCUMENTS

| | | |
|---|---|---|
| 6,901,808 B1 * | 6/2005 | Sharpless et al. ............... 73/724 |
| 7,005,372 B2 | 2/2006 | Levy |
| 7,141,494 B2 | 11/2006 | Lee |
| 7,871,678 B1 | 1/2011 | Greer et al. |
| 2001/0016364 A1 * | 8/2001 | Loan et al. ...................... 438/14 |
| 2004/0157430 A1 * | 8/2004 | Mandal ......................... 438/636 |
| 2005/0056217 A1 * | 3/2005 | Yamada et al. ............... 118/715 |
| 2006/0165892 A1 | 7/2006 | Weidman |
| 2007/0190266 A1 | 8/2007 | Fu |
| 2009/0291549 A1 * | 11/2009 | Yamasaki et al. ............. 438/585 |

OTHER PUBLICATIONS

U.S. Appl. No. 11/520,497 entitled "Method of Reducing Plasma Stabilization Time in a Cyclic Deposition Process", filed Sep. 12, 2006.

U.S. Appl. No. 13/084,399 entitled "Plasma Activated Conformal Film Deposition", filed Apr. 11, 2011.

U.S. Appl. No. 13/084,305 entitled "Improved Silicon Nitride Films and Methods", filed Apr. 11, 2011.

* cited by examiner

METHOD OF IMPROVING FILM NON-UNIFORMITY AND THROUGHPUT

CROSS-REFERENCE TO RELATED APPLICATIONS

This application claims benefit under 35 U.S.C. §119(e) to U.S. Provisional Patent Application No. 61/351,058, filed Jun. 3, 2010, which is herein incorporated by reference.

BACKGROUND

Showerheads are often used in semiconductor fabrication process equipment to distribute process gasses across the surface of a wafer or substrate during deposition, etching, and other processes. A showerhead may also serve as an electrode in a semiconductor fabrication process employing a plasma. Showerheads are generally designed for a steady state flow of gasses. This steady state flow design for a showerhead is based on the principle that a front of backpressure may be established across the entire showerhead plenum, creating sufficient resistance that uniformly spreads the gas flow across the face of the showerhead.

SUMMARY

Methods, apparatus, and systems for depositing materials are provided. According to various implementations, the methods involve pressurizing a volume with a gas. The pressurized gas is released to a showerhead. In some implementations, the pressurized gas released to the showerhead reduces the duration of time to develop a spatially uniform gas flow across the faceplate of the showerhead.

In some implementations, a method includes providing a wafer substrate to a chamber of an apparatus. The apparatus includes a showerhead to deliver a gas to the chamber, a volume, and an isolation valve between the volume and the showerhead. The gas is delivered to the volume when the isolation valve is closed. The isolation valve is opened to allow the gas to flow to the showerhead when the gas is being delivered to the volume. A material is formed on the wafer substrate, and the gas is used for forming the material.

In some implementations, a method includes providing a wafer substrate to a chamber of an apparatus. The apparatus includes a showerhead to deliver a first gas and a second gas to the chamber, a first volume, a first isolation valve between the first volume and the showerhead, a second volume, and a second isolation valve between the second volume to the showerhead. The first gas is delivered to the first volume when the first isolation valve is closed. The first isolation valve is opened to allow the first gas to flow to the showerhead when the first gas is being delivered to the first volume. The first isolation valve is closed. The second gas is delivered to the second volume when the second isolation valve is closed. After the first isolation valve is closed, the second isolation valve is opened to allow the second gas to flow to the showerhead when the second gas is being delivered to the second volume. The second isolation valve is then closed.

In some implementations, an apparatus for forming a material includes a process chamber including a showerhead, a volume configured to contain a gas, an isolation valve between the volume and the showerhead, and a controller including program instructions for conducting a process. The process includes delivering the gas to the volume when the isolation valve is closed, opening the isolation valve to allow the gas to flow to the showerhead when the gas is being delivered to the volume, and forming a material on a wafer substrate contained within the chamber, wherein the gas is used for forming the material.

In some implementations, a non-transitory computer machine-readable medium includes program instructions for control of an apparatus. The apparatus includes a chamber, a showerhead to deliver a gas to the chamber, a volume, and an isolation valve between the volume and the showerhead. The program instructions include code for operations including: delivering the gas to the volume when the isolation valve is closed; opening the isolation valve to allow the gas to flow to the showerhead when the gas is being delivered to the volume; and forming a material on a wafer substrate contained within the chamber, wherein the gas is used for forming the material.

These and other aspects of implementations of the invention are described further below with reference to the figures.

BRIEF DESCRIPTION OF THE DRAWINGS

The accompanying drawings, which are incorporated in and form part of the specification, illustrate implementations of the invention, and together with the detailed description, serve to explain implementations of the invention.

DETAILED DESCRIPTION

Introduction

Figure 1A:
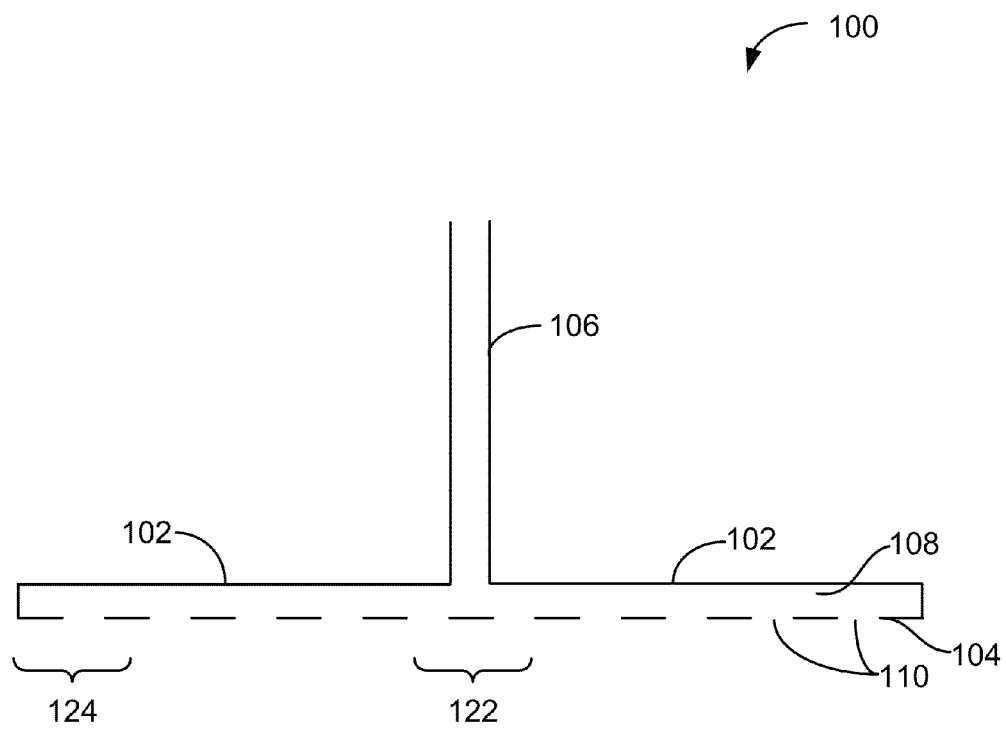
FIG. 1A shows an example of a cross-sectional schematic illustration of a showerhead.

In the following detailed description of the present invention, numerous specific implementations are set forth in order to provide a thorough understanding of the invention. However, as will be apparent to those of ordinary skill in the art, the present invention may be practiced without these specific details or by using alternate elements or processes. In other instances well-known processes, procedures, and components have not been described in detail so as not to unnecessarily obscure aspects of the present invention.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards and the like.

Some implementations described herein relate to methods, apparatus, and systems for depositing materials with gaseous precursors. For example, an apparatus for performing the methods descried herein may include a showerhead to deliver a gas to a chamber, a volume, and an isolation valve between the volume and the showerhead. A gas may be delivered to the volume when the isolation valve is closed, pressurizing the volume. Pressurizing the volume with the gas may occur instead of the gas being diverted to a sump or other excess gas containment system, for example. The isolation valve may be opened to allow the gas to flow to the showerhead when the gas is being delivered to the volume. A material may be formed on the wafer substrate using the gas. In some implementations, releasing the pressurized gas from the volume reduces the duration of time to develop a spatially uniform gas flow across the showerhead.

In the fabrication of an integrated circuit, materials may be deposited using many different techniques, including chemical vapor deposition (CVD) processes, atomic layer deposition (ALD) processes, and conformal film deposition (CFD) processes. In some implementations, a deposited material has a uniform thickness across the wafer substrate or work piece onto which the material was deposited. Large thickness non-uniformities in deposited materials are not acceptable for many commercial processes, particularly processes for advanced technology nodes.

CVD, ALD, and CFD are all thin film deposition techniques performed with one or more chemical reactants, also referred to as precursors. CVD processes involve admitting the precursors to a chamber in a gaseous state. The precursors react and/or decompose on the work piece (i.e., the surface or surfaces that are being coated with a reaction product), producing a thin film of material. A plasma-enhanced CVD (PECVD) process is a type of CVD process in which a plasma is generated with the precursors. A plasma in a PECVD process may induce many processes and chemical reactions that would otherwise be very improbable at lower temperatures.

An ALD process is also a thin film deposition technique performed with one or more chemical reactants, also referred to as precursors. ALD processes are based on sequential, self-limiting surface reactions. The precursors are sequentially admitted to a chamber in a gaseous state where they contact the work piece. Each precursor may be admitted to the chamber for a short period of time. For example, a precursor may be admitted to the chamber for about 5 seconds or less, about 3 seconds or less, about 1 second or less, or about 0.5 seconds or less, depending on the particular ALD process. For example, a first precursor is adsorbed onto the surface when it is admitted to a chamber. Then, the first precursor reacts with a second precursor at the surface when the second precursor is admitted to the chamber. By repeatedly exposing a surface to alternating sequential pulses of the precursors, a thin film of material is deposited. ALD processes also include processes in which a surface is exposed to sequential pulses of a single precursor, which also may deposit a thin film of material on the surface. ALD processes generally form a conformal layer, i.e., a layer that faithfully follows the contours of the underlying surface.

ALD processes are similar to CVD processes, with a major difference being that an ALD reaction keeps the bulk precursor materials separate during the reaction. Further, by limiting the amount of reactant used in a reaction cycle, very precise control of the film growth can be obtained. This, however, also makes ALD processes limited to depositing relatively thin films, as film growth is relatively slow with ALD processes due to the requirement of sequentially exposing a surface to the precursors.

An ion-induced atomic layer deposition (iALD) process is a type of ALD process. For example, in one implementation of an iALD process, a first precursor is adsorbed onto the surface when it is admitted to a chamber. The excess precursor (i.e., the precursor that is not adsorbed onto the work piece) is purged from the chamber using a gas. RF power is then applied to the gas, which may form a plasma including ions and radicals. The ions may provide energy to induce a chemical reaction between the adsorbed first precursor and the radicals, forming a monolayer of material. Finally, the chamber is purged to remove any chemical byproducts. This process may be repeated until a desired thickness of the material is formed.

iALD processes are described in U.S. Pat. No. 6,428,859, U.S. Pat. No. 6,416,822, and U.S. Pat. No. 7,871,678, all of which are herein incorporated by reference. iALD processes are also described in U.S. patent application Ser. No. 11/520,497, entitled "METHOD OF REDUCING PLASMA STABILIZATION TIME IN A CYCLIC DEPOSITION PROCESS," filed Sep. 12, 2006, which is herein incorporated by reference.

CFD techniques are similar to ALD techniques in that deposition is performed over multiple cycles, with each cycle employing a relatively small amount of reactant/precursor; the amount of reactant/precursor is limited by the capacity of a substrate surface to adsorb the reactant. Typically, the surface reaction to produce a CFD film is activated by exposure of the surface-adsorbed reactant(s) to a plasma, ultraviolet radiation, or similar source. Generally, CFD processes proceed more rapidly than ALD processes, as one or more purge steps are removed. In some cases, one reactant flows continuously during the deposition process, which may include several cycles of CFD. Unlike ALD processes, many CFD processes allow two or more reactants to co-exist in the vapor phase within a chamber. This would of course be the case if one of the reactants flows continuously. Note, however, that the CFD reactants are chosen so that the reaction between them has a relatively high activation energy, thereby avoiding vapor phase reactions; that is, the reaction takes place only upon exposure to an activation energy source (e.g., a plasma). Exposure to an activation energy is limited to portions of the CFD process cycle where multiple reactants are not present in the vapor phase.

CFD processes are further described in U.S. patent application Ser. No. 13/084,399, entitled "PLASMA ACTIVATED CONFORMAL FILM DEPOSITION," filed Apr. 11, 2011, and in U.S. patent application Ser. No. 13/084,305, entitled "IMPROVED SILICON NITRIDE FILMS AND METHODS," filed Apr. 11, 2011, both of which are herein incorporated by reference.

CVD processes, ALD processes, and CFD processes used in the fabrication of an integrated circuit require gasses, such as precursors, to be flowed in a uniform or controlled manner over a wafer substrate undergoing processing. To that end, a "showerhead" gas flow device may be used to distribute gasses across the surface of a wafer substrate. Gasses may be flowed out of the showerhead and distributed across a wafer substrate; the wafer substrate may be supported by a pedestal assembly within a chamber housing the showerhead. Distribution of the gasses across the wafer substrate is accomplished through a pattern of gas distribution holes which direct the flow of gasses from inside the showerhead to the wafer substrate.

Apparatus

Figure 1B:
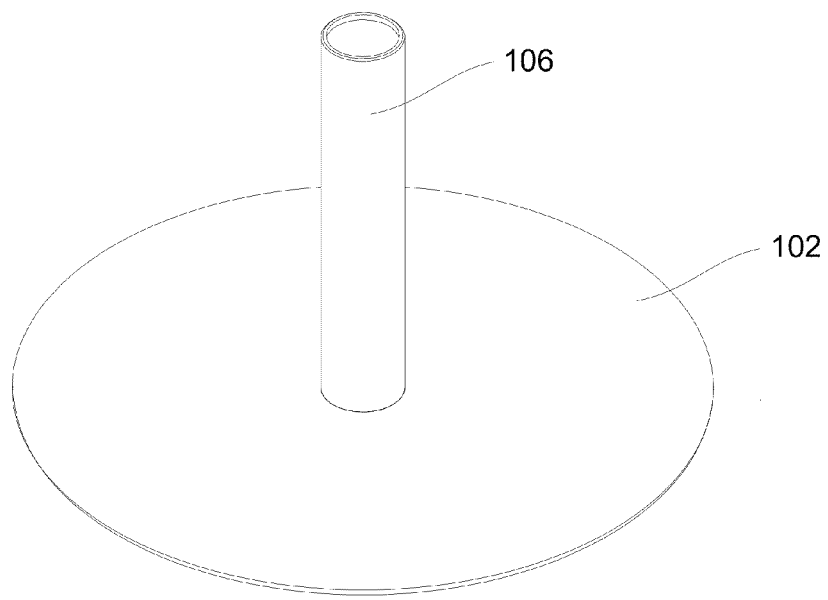
FIG. 1B shows an example of an isometric view of a showerhead backplate and stem.
Figure 1C:
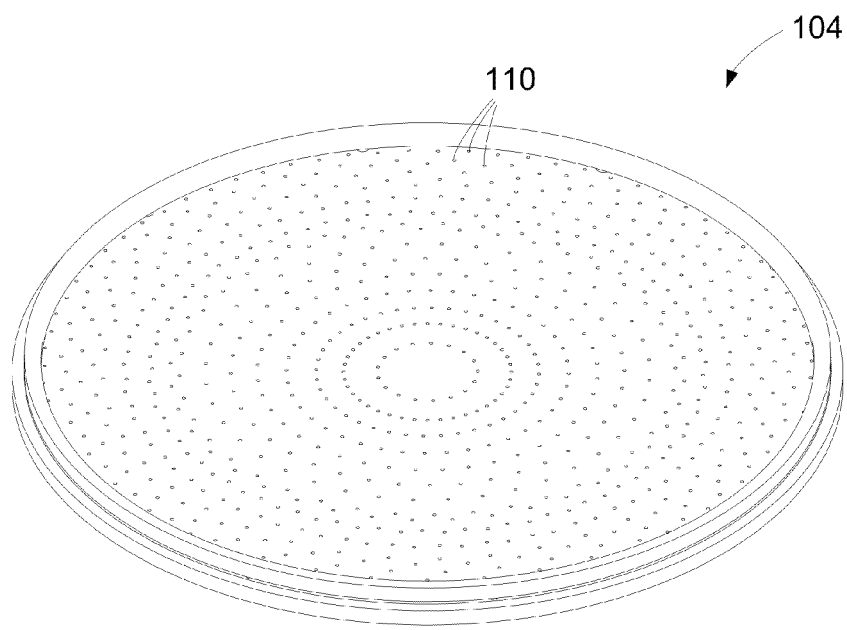
FIGS. 1C and 1D show examples of isometric views of a showerhead faceplate.
Figure 1D:
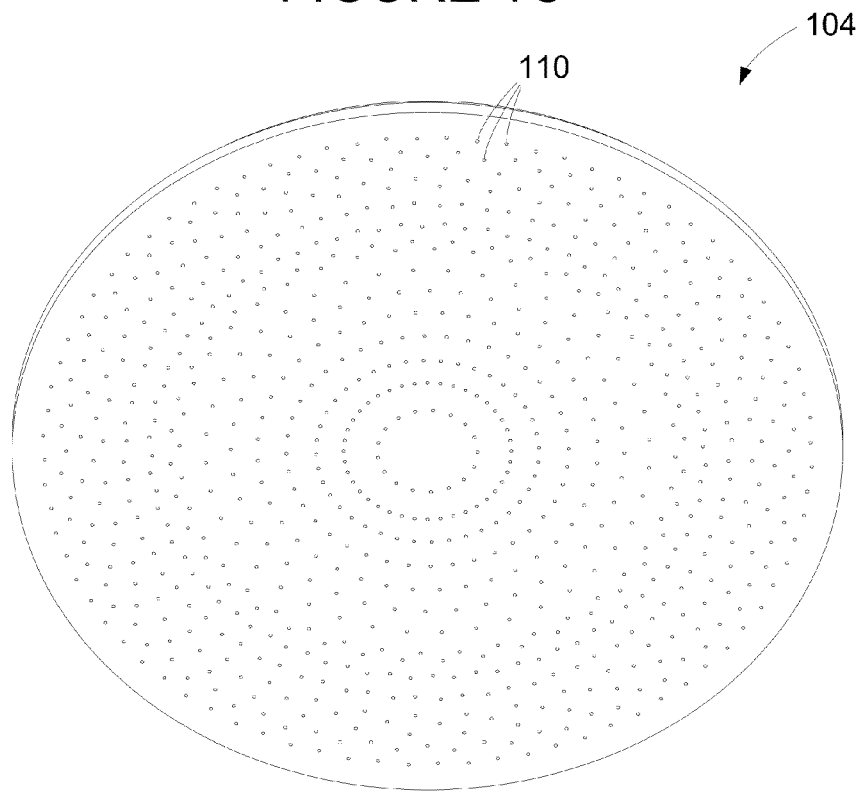

FIG. 1A shows an example of a cross-sectional schematic diagram of a showerhead. The showerhead 100 includes a backplate 102, a faceplate 104, a stem 106, and a plenum 108. The stem 106 is attached to the backplate 102, and delivers a gas to the plenum 108. The plenum 108 includes a region 122 near the region where gas first enters the plenum 108 from the stem 106. The plenum 108 also includes a region 124 at the radial edges of the plenum 108. The showerhead faceplate 104 includes a plurality of holes 110 for delivery of a gas across a wafer substrate. FIG. 1B shows an example of an isometric view of the showerhead backplate 102 and the stem 106. FIGS. 1C and 1D show examples of isometric views of the showerhead faceplate 104.

The volume of the plenum 108 may depend on the size of the showerhead 100. For example, for a showerhead configured for processing 200 millimeter wafer substrates, the volume of the plenum may be about 89 to 890 milliliters. For a showerhead configured for processing 300 millimeter wafer substrates, the volume of the plenum may be about 200 to 2000 milliliters. For a showerhead configured for processing 450 millimeter wafer substrates, the volume of the plenum may be about 450 to 4500 milliliters. In some implementations, the volume of the plenum is minimized, as explained further below.

Figure 2:
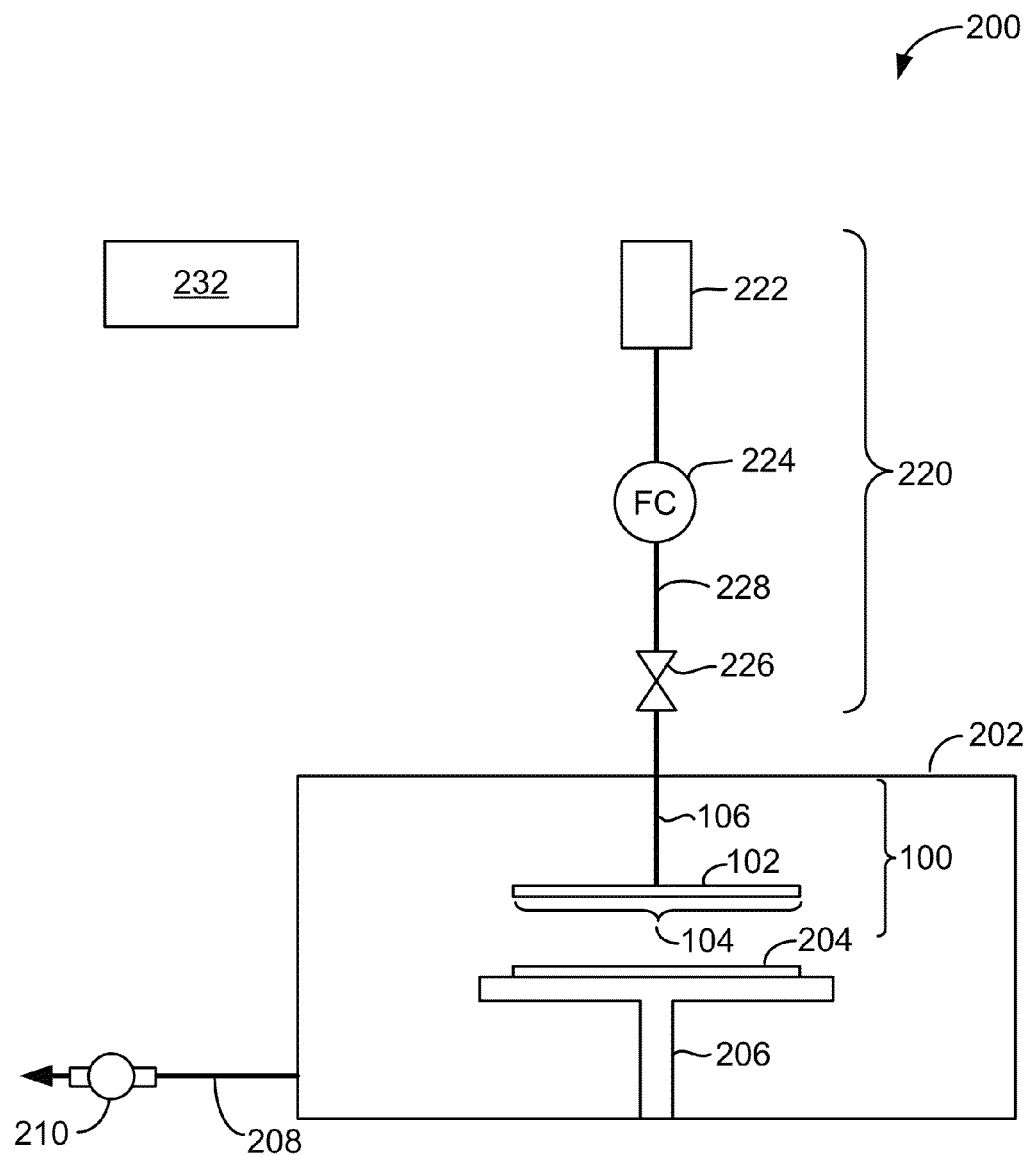
FIG. 2 shows an example of a schematic diagram of an apparatus for performing the methods disclosed herein.

FIG. 2 shows an example of a schematic diagram of an apparatus for performing the methods disclosed herein. A suitable apparatus for performing the methods disclosed herein includes hardware for accomplishing the process operations and may include a system controller having instructions for controlling process operations in accordance with implementations of the present invention. The apparatus 200 includes a chamber 202, also referred to as a process chamber or a reactor chamber. The chamber 202 may be a CVD process chamber, a PECVD process chamber, an ALD process chamber, or an iALD process chamber, for example. The chamber 202 provides a controlled environment during wafer substrate processing and includes various mechanical and electrical systems used during wafer substrate processing.

For example, the chamber 202 includes the showerhead 100 for delivering gasses across the surface of a wafer substrate 204. The chamber 202 further includes a pedestal 206 which supports the wafer substrate 204. In some implementations, the pedestal 206 may include a chuck to prevent the wafer substrate 204 from movement or misalignment during processing operations. In some implementations, the pedestal 206 may be raised or lowered by a drive actuator to facilitate loading or unloading of the wafer substrate 204 from the pedestal 206 or to establish optimal spacing between the wafer substrate 204 and the faceplate 104 of the showerhead 100. Gasses within reactor 100 may be evacuated through the outlet line 208 with a vacuum pump 210.

In some implementations, the showerhead 100 may be a showerhead configured for processing 200 millimeter, 300 millimeter, and 450 millimeter wafer substrates. While the showerhead 100 in the chamber 202 is shown as a "chandelier" type showerhead, other implementations may use other showerheads, such as a "flush-mount" showerhead for example. Further, other geometries of a showerhead faceplate, such as a rectangular, square, or oval geometry, may be appropriate, depending on the geometry of the wafer substrate or work piece being processed.

The apparatus 200 also includes a gas system 220 including a gas source 222, a flow control device 224, and an isolation valve 226 between the flow control device 224 and the showerhead 100. Gas source 222 provides a gas to the flow control device 224. Between the flow control device 224 and the isolation valve 226 is a volume 228. The volume may include a gas flow line or a chamber, for example.

The gas source 222 may contain any number of different gasses used in CVD, ALD, or CFD processes. For example, the gas source 222 may contain precursor gasses or non-precursor gasses. A precursor is a compound that participates in a chemical reaction that produces another compound. The term "precursor," as used herein in the context of the apparatus and methods, may refer to the combination of the actual reactive precursor and an associated carrier gas, such as argon. Often, the "precursor" used in a deposition process is produced by bubbling a carrier gas through a liquid form of the precursor. Of course, depending on the physical properties of the precursor under consideration, a bubbler and/or carrier gas may or may not be appropriate. A non-precursor gas may be a gas used as a purge gas to remove a precursor gas from the chamber or to form a plasma, for example.

Some implementations of the flow control device 224 may include a mass flow controller (MFC), for example. A MFC is a device used to measure and control the flow of gasses. MFCs generally include an inlet port, an outlet port, a mass flow sensor, and a proportional control valve. A mass flow controller may be set such that it delivers a specified flow of a gas.

The apparatus 200 shown in FIG. 2 includes one gas system 220. In other implementations, an apparatus may include multiple gas systems for delivering different precursor gasses, purge gasses, or other processing gasses to the chamber 202 as appropriate for the particular deposition process. When more than one gas system is included with the apparatus 200, the showerhead 100 may include multiple stems. Alternatively, when more than one gas system is part of the apparatus 200, a manifold or other device may be used to route the gasses to the showerhead stem 106.

Some implementations of the apparatus 200 may further include a controller 232 configured to control the operations of the components of the apparatus 200, including the flow control device 224, the isolation valve 226, and the vacuum pump 210, for example. The controller 232 typically includes one or more memory devices and one or more processors configured to execute the instructions so that the apparatus may perform a method in accordance with implementations described herein. Machine-readable media containing instructions for controlling process operations in accordance with implementations of the present invention may be coupled to the controller 232.

The apparatus 200 shown in FIG. 2 is one implementation of an apparatus which may be used in semiconductor fabrication processes. Additional components may be added as necessary, and some components may not be necessary in all cases. For example, in implementations in which a plasma is formed in the chamber 202, such as PECVD processes and iALD processes, the apparatus 202 includes a power source for generating a plasma, such as an RF power source. Additionally, the structures shown may vary considerably from one reactor design to the next.

As noted above, showerheads are generally designed for a steady state flow of a gas. This steady state flow design for a showerhead is based on the principle that a front of backpressure is established across the entire showerhead plenum, creating sufficient resistance that uniformly spreads the gas flow across the faceplate of the showerhead. In such a steady state arrangement, although a dynamic pressure drop may exist from the inlet (i.e., at the stem connected at the backplate) to the outlets at the geometric extents of the showerhead (i.e., at the holes on the edges of the faceplate), flow may be uniform from each outlet of the showerhead, resulting in a spatially uniform flow across the showerhead faceplate.

Spatially non-uniform flow across the showerhead faceplate may be observed, however, when a gas is first introduced to a showerhead. For example, before a gas is introduced to the showerhead, the plenum of the showerhead may be at the same pressure as the chamber. When a gas is introduced to the showerhead, such as the showerhead 100, for example, the regions in the plenum near the stem increase in pressure, but there may be little increase in pressure in regions a distance away from the stem. The region 122 increases in pressure, but there may be little increase in pressure in the region 124, for example. This difference in pressure increases in regions of the plenum results in a spatially non-uniform flow across the showerhead faceplate. Stated in a different manner, the plenum of the showerhead takes a certain duration of time to be filled with the gas, after which a spatially uniform flow across the showerhead faceplate may be attained. During this time, gas at higher pressures in the plenum in the region near the gas entry point may exit from the plurality of holes in this region.

As noted above, spatially uniform flow may be attained across the faceplate of the showerhead after a period of time. For example, at a time after a gas is introduced to the showerhead 100, a uniform pressure will be attained in the plenum 108, resulting in a spatially uniform flow across the showerhead faceplate. Thus, the flow across a showerhead faceplate may vary both spatially and temporally when a gas is first introduced to the showerhead. Computer modeling of the flow of a gas as it enters an exemplary showerhead has shown that it takes on the order of a second to attain a spatially uniform flow across the showerhead faceplate. While designing a showerhead such that the volume of the plenum is minimized aids in quickly attaining a spatially uniform flow, transients may still be observed in such a showerhead.

Without being bound by any particular theory, it is believed that for some deposition processes, the spatially non-uniform flow across the showerhead faceplate may result in thickness non-uniformities in the material being deposited. As noted above, large thickness non-uniformities in deposited materials are not acceptable for many commercial processes.

For example, in some deposition processes, such as cyclic deposition processes, gas flow durations are short. Some ALD processes in which a first gas is admitted to the chamber, and then a second gas is admitted to the chamber, with this cycle being repeated until a desired film thickness is attained, may be considered cyclic deposition processes, for example. As noted above, in some ALD processes, the flow of a gas into the chamber may be one second or less. With such a short duration of the flow of the gas into the chamber, the spatial and temporal transients associated with the gas flow from the faceplate of the showerhead may be long compared to the duration of the steady state uniform flow. In other words, a significant fraction of the total delivery time for a gas in a given deposition cycle may exhibit a non-steady state non-uniform flow across the faceplate of the showerhead. As a result, the spatially non-uniform flow may become significant. This issue may be more pronounced for iALD and CFD processes, for example, which further include plasma species such as ions and radicals, with the spatially non-uniform flow impacting both a precursor gas flow and an ion flux to the wafer substrate.

Implementations of the disclosed methods and apparatus may improve deposition processes employing a showerhead to expose a work piece or a wafer substrate to a gas by reducing the transient flow, especially the spatially non-uniform flow across the faceplate of the showerhead. Implementations of the disclosed methods and apparatus may improve deposition processes employing longer duration flows of gasses in which the initial transients result in thickness non-uniformities in the deposited materials. Implementations of the disclosed methods and apparatus also may improve deposition processes employing short duration flows of gasses (e.g., ALD processes) by reducing the transient flow.

Figure 3A:
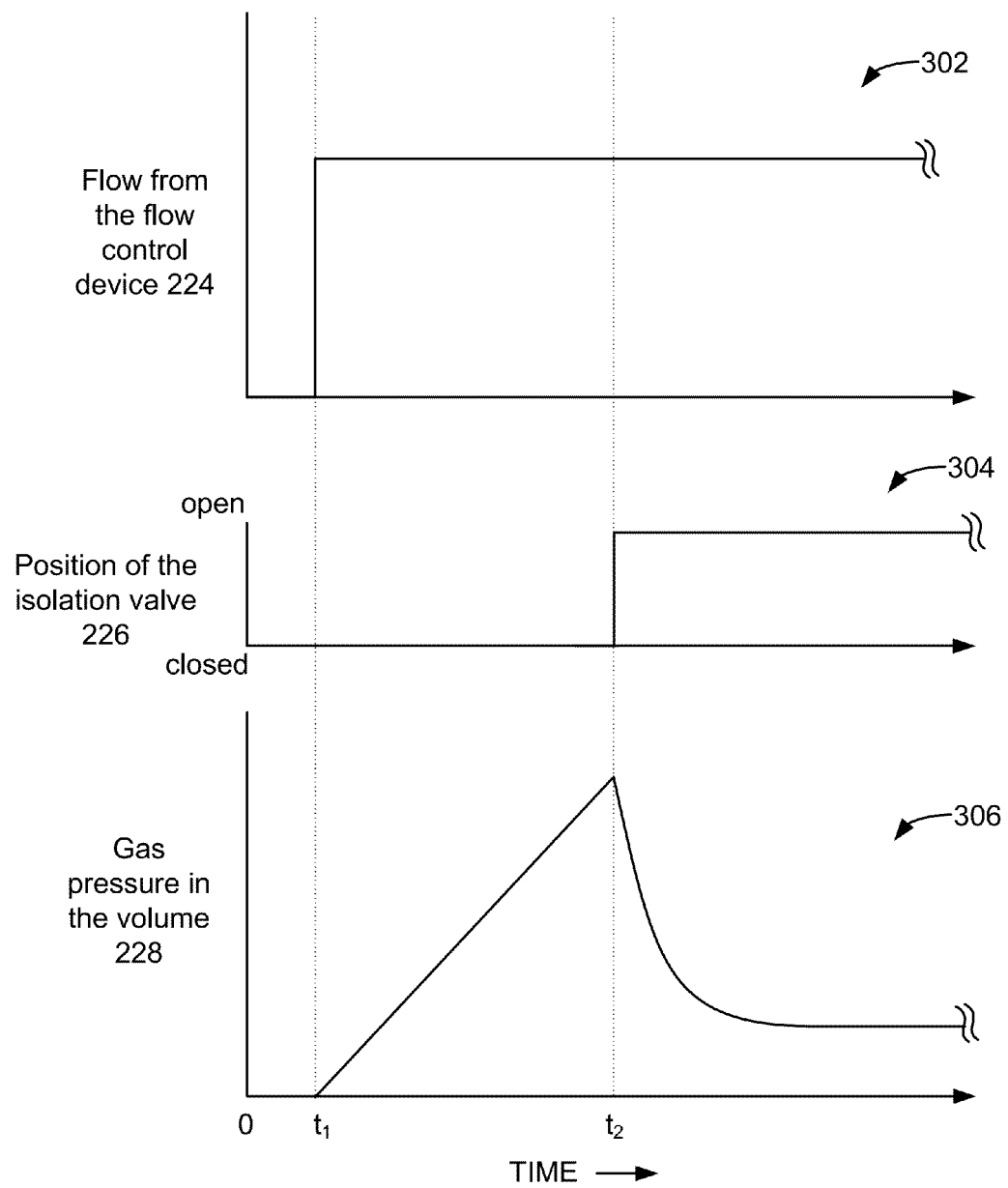
FIGS. 3A and 3B show examples of timing diagrams for the operation of the apparatus shown in FIG. 2.
Figure 3B:
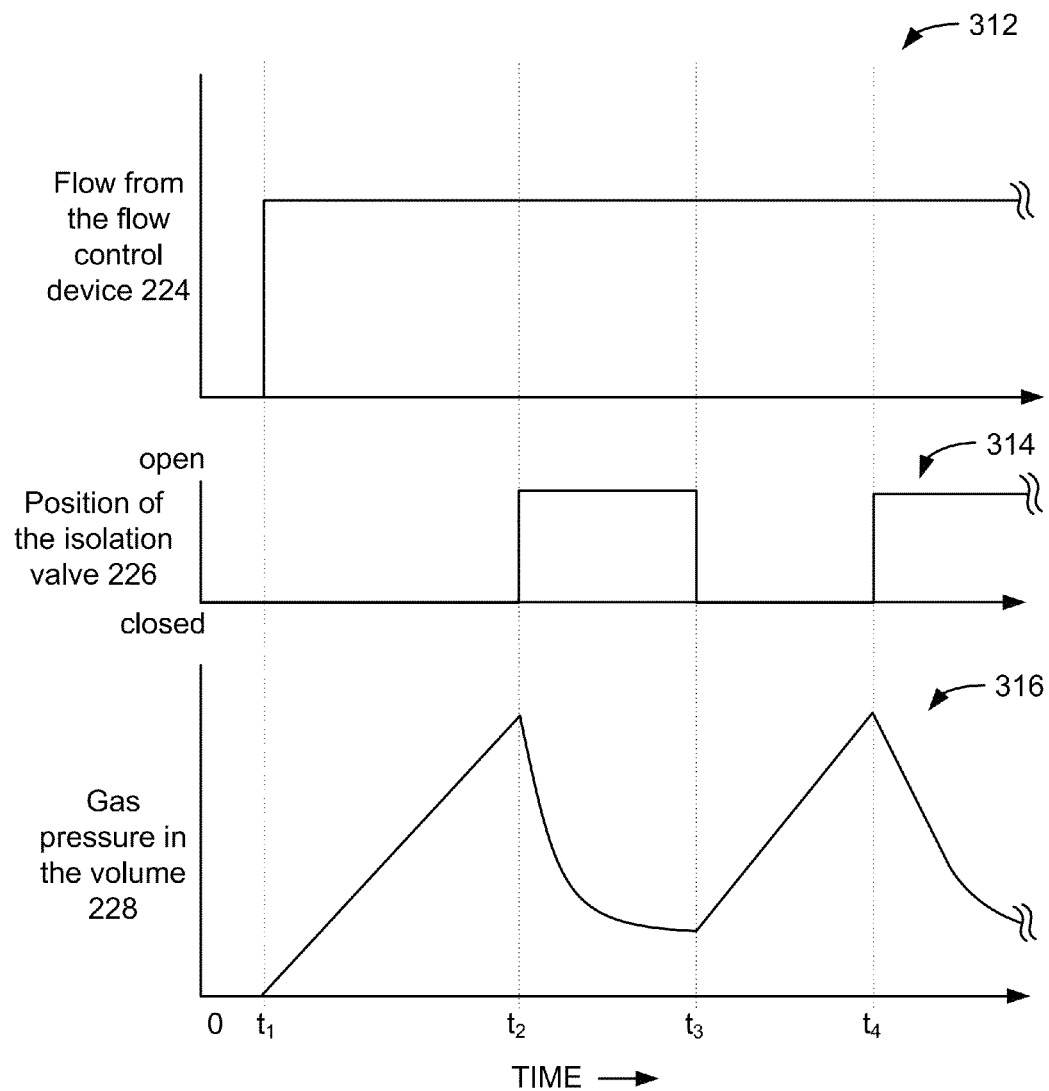

FIGS. 3A and 3B show examples of timing diagrams for the operation of the apparatus 200 shown in FIG. 2. In FIG. 3A, plot 302 shows the gas flow from the flow control device 224, plot 304 shows the position of the isolation valve 226, and plot 306 shows the gas pressure in the volume 228. The process operation begins at $t_1$, at which time gas flow from the flow control device 224 begins. At $t_1$, the isolation valve 226 is closed, separating the volume 228 from the showerhead 100, and a gas pressure in the volume 228 starts increasing.

At $t_2$, the isolation valve 226 is opened while gas flow from the flow control device 224 continues. As shown in plot 302, in some implementations, the gas flow from the flow control device 224 may stay at the same level when the isolation valve 226 is opened. In other implementations, the gas flow from the flow control device 224 may increase or decrease. In some implementations, the gas flow from the flow control device 224 is continuous with the gas constantly flowing from the flow control device 224 after $t_1$.

With the isolation valve 226 opened at $t_2$, gas pressure in the volume 228 decreases and may reach a steady state after a period of time.

For the sequence of operations described above with reference to FIG. 3A, a pressurized volume of gas is released from the volume 228 when the isolation valve 226 is opened at $t_2$. In some implementations, before the isolation valve 226 is opened, the showerhead plenum 108 is at the same pressure as the chamber 202. The pressurized volume of gas released from the volume 228 rapidly fills the plenum 108 of the showerhead 100. This rapid filling of the plenum 108 of the showerhead 100 with the gas reduces the time in which a substantially spatially uniform gas flow across the showerhead faceplate 104 is developed. In some implementations, the time to develop a substantially spatially uniform flow across the showerhead faceplate is not greater than about 0.5 seconds or not greater than about 0.2 seconds.

The operations associated with the timing diagrams shown in FIG. 3A may be applicable to deposition processes employing a longer steady state flow of a gas in which an initial spatially non-uniform flow across the faceplate of a showerhead may result thickness non-uniformities in the deposited material. For example, such a deposition processes may include a CVD process in which a precursor gas is admitted to a chamber in which a wafer substrate has been heated to an elevated temperature. In this case, deposition of a material onto the wafer substrate may begin when the precursor gas is admitted. As another example, such a deposition process may include a PECVD process in which a precursor gas is admitted to a chamber containing a wafer substrate, with an electric field already established between the showerhead and the wafer substrate pedestal. In this case, a plasma may ignite when the precursor gas is admitted to the chamber and deposition of a material onto the wafer substrate may begin when the precursor gas is admitted. Further, such deposition processes may include CVD and PECVD processes with a short deposition time.

FIG. 3B shows another example of a timing diagram for the operation of the apparatus 200 shown in FIG. 2. In FIG. 3B, plot 312 shows the gas flow from the flow control device 224, plot 314 shows the position of the isolation valve 226, and plot 316 shows the gas pressure in the volume 228. The process operation begins at $t_1$, at which time gas flow from the flow control device 224 begins. At $t_1$, the isolation valve 226 is closed, separating the volume 228 from the showerhead 100, and a gas pressure in the volume 228 starts increasing.

At $t_2$, the isolation valve 226 is opened while gas flow from the flow control device 224 continues. With the isolation valve 226 opened at $t_2$, the gas pressure in the volume 228 decreases and may reach a steady state after a period of time. If, however, the duration of time between $t_2$ and $t_3$ is too short, the gas pressure in the volume 228 may not reach a steady state.

At $t_3$, the isolation valve 226 is closed while gas flow from the flow control device 224 continues. With the isolation valve 226 closed at $t_3$, separating the volume 228 from the showerhead 100, the gas pressure in the volume 228 increases.

At $t_4$, similar to $t_2$, the isolation valve 226 is opened while gas flow from the flow control device 224 continues. With the isolation valve 226 opened at $t_4$, the gas pressure in the volume 228 decreases and may reach a steady state after a period of time.

This cyclic process may continue as many times as is necessary for the particular deposition process being performed. The volume of the gas released to the plenum 108 of the showerhead 100 at $t_2$ and $t_4$ rapidly fills the plenum 108 of the showerhead 100. This rapid filling of the plenum 108 of the showerhead 100 with the gas reduces the time in which a substantially spatially uniform gas flow across the showerhead faceplate 104 is developed. In some implementations, the time to develop a substantially spatially uniform flow across the showerhead faceplate is not greater than about 0.5 seconds or not greater than about 0.2 seconds.

The operations associated with the timing diagrams shown in FIG. 3B may be applicable to deposition processes employing short duration flows of gasses by reducing the transient flow. For example, such deposition processes may include an ALD process in which precursor gasses are sequentially admitted to a chamber containing a wafer substrate. As another example, such deposition processes may include an iALD process.

An exemplary iALD process for depositing a tantalum nitride (TaN) or a tantalum carbo-nitride (TaCN) barrier layer includes:
 (a) about 0.5 seconds of flow of a precursor gas (e.g., tert-butylimino tris(diethylamino) tantalum, or TBT-DET) to a chamber containing the wafer substrate;
 (b) about 0.5 seconds of flow of an argon/hydrogen gas mixture ($Ar/H_2$, at about a 4:1 volume ratio) to purge the chamber;
 (c) about 0.5 seconds of flow of an $Ar/H_2$ gas mixture (at about a 4:1 volume ratio) to form a plasma to deposit a TaN film;
 (d) about 0.5 seconds of flow of an $Ar/H_2$ gas mixture (at about a 4:1 volume ratio) to purge the chamber; and
 (e) repeat (a)-(d) until a sufficient thickness of TaN is deposited.

In this exemplary iALD process, the precursor gas may be pressurized in a volume of the precursor gas delivery system while other process operations (e.g., purge and plasma operations) are occurring. Further, the $Ar/H_2$ gas mixture may be pressurized in a volume of another gas delivery system while the precursor operations are occurring, in some implementations.

In some implementations, the ratio of the pressure in the chamber (and of the showerhead plenum) to the pressure in the pressurized volume is about 1:2 or at least about 1:2 immediately prior to delivery of the gas to the chamber (and the plenum). That is, the gas pressure in the pressurized volume is about twice or at least about twice the pressure of the chamber immediately prior to delivery of the gas to the chamber. In some implementations, the pressure of a gas in the pressurized volume is at least about 100 Torr or at least about 200 Torr prior to delivery of the gas to the showerhead plenum. In other implementations, the pressure of a gas in the pressurized volume is about 100 to 200 Torr prior to delivery of the gas to the showerhead plenum. In some implementations, the methods described herein provide a supersonic burst of a gas from the pressurized volume to the showerhead plenum.

In some implementations, the volume that is pressurized with the gas to be delivered to the showerhead plenum and the flow rate of the gas from the flow control device may be specified such that the duration of the spatially non-uniform flow across the faceplate of the showerhead is minimized. For example, in one system, the effective chamber volume is about 0.6 liters for an actual chamber volume of about 7 liters, and the operating pressure of the chamber is about 2 Torr. The volume of the showerhead plenum of a showerhead used with the chamber may be about 200 to 2000 milliliters. With such a showerhead, a pressurized volume of about 5 milliliters that reaches a pressure of about 1300 to 3000 Torr may be used.

Further, the volume of the showerhead plenum to the volume of the pressurized volume may be about 40:1 to 400:1, in some implementations. The ratio of the operation pressure of the chamber and the showerhead to the pressure in the pressurized volume may be about 1:650 to 1:1500 prior to delivery of the gas to the showerhead, in some implementations. Generally, the larger the volume of the pressurized volume and the higher the pressure in the pressurized volume prior to delivery of the gas to the showerhead, the shorter the duration of the transient flow.

Method

The methods described herein may be used to quickly establish a spatially uniform flow across the face of a showerhead. Generally, implementations of the methods include:
 a) pressurizing a volume separated from the showerhead with a gas without delivering any of the gas to the showerhead; and
 (b) releasing the gas from the pressurized volume to the showerhead to quickly establish a spatially uniform flow of the gas across the showerhead faceplate.

As noted above, the methods may be used with deposition processes, including CVD, ALD, or CFD processes currently commercialized and those currently under development.

Figure 4A:
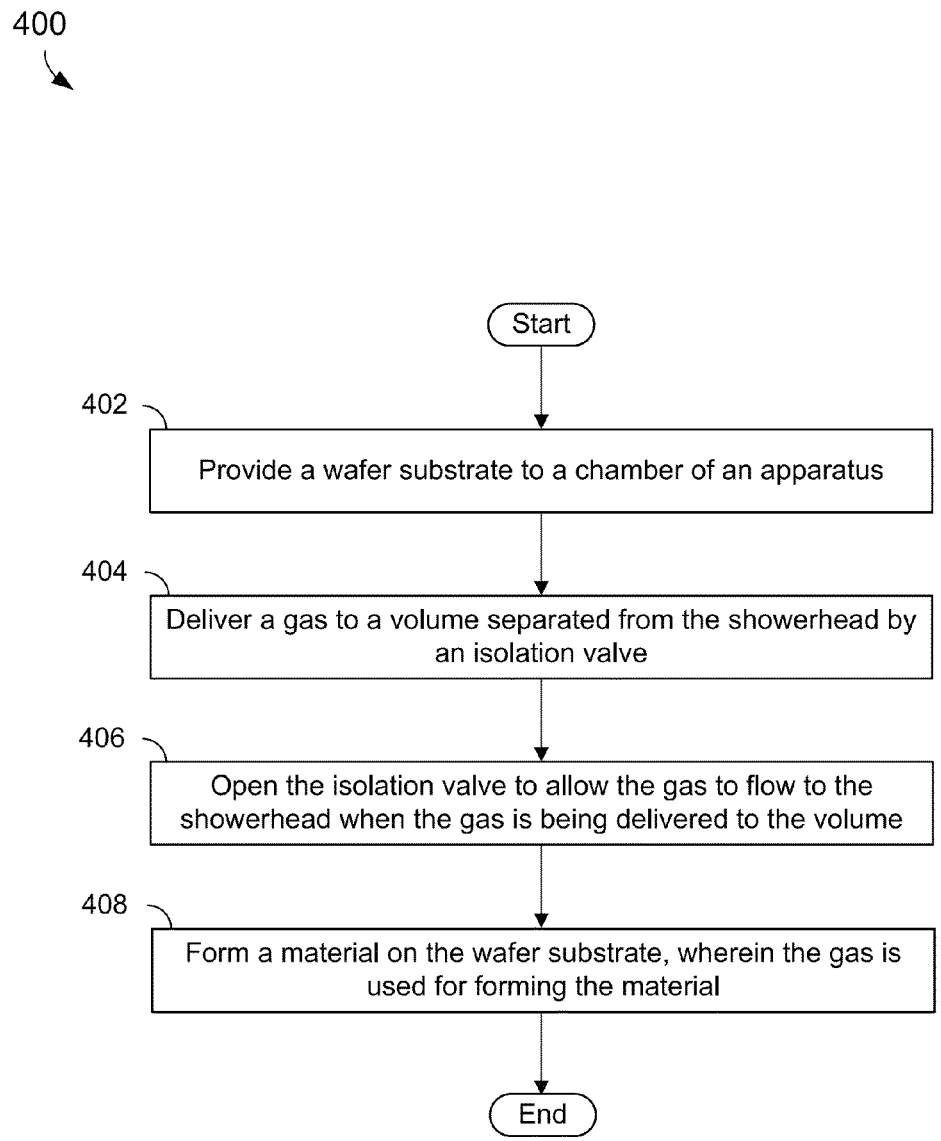
FIGS. 4A and 4B show examples of flow diagrams illustrating processes for depositing a material.

FIG. 4A shows an example of a flow diagram illustrating a process for depositing a material. At block 402 of the method 400, a wafer substrate is provided to a chamber of an apparatus. The apparatus includes a showerhead to deliver a gas to the chamber, a volume, and an isolation valve between the volume and the showerhead.

In some implementations, the showerhead includes an inlet for the gas, a faceplate having a plurality of holes, and an area into which the gas travels from the inlet to the plurality of holes. This area may be referred to as a plenum.

In some implementations, the apparatus may further include a flow control device. For example, the flow control device may receive a gas from a gas source and deliver the gas to the volume. In some implementations, the flow control device may include a mass flow controller. The mass flow controller may include a flow measurement sensor and a proportional control valve.

At block 404, the gas is delivered to the volume separated from the showerhead by an isolation valve. In some implementations, the volume may be separated from the showerhead when the isolation valve is closed. In some implementations, delivering the gas to the volume when the isolation valve is closed pressurizes the volume behind the isolation valve. In some implementations, the gas does not flow to the showerhead when the isolation valve is closed. In some implementations, delivering the gas to volume is continuous once the delivery begins; delivering the gas to the volume may stop at the end of the process.

At block 406, the isolation valve is opened to allow the gas to flow to the showerhead when the gas is being delivered to the volume. In some implementations, a pressure in the volume is about 100 to 200 Torr before the isolation valve is opened. In other implementations, the ratio of a pressure in the volume to a pressure in the chamber is about 2:1 before the isolation valve is opened.

The pressurized volume of gas that flows to the showerhead reduces the duration of the spatially non-uniform flow from the showerhead faceplate, in some implementations. In some implementations, a substantially spatially uniform flow of the gas across the faceplate of the showerhead is achieved. In some implementations, such a substantially spatially uniform flow of the gas across the faceplate of the showerhead is achieved in less than about 0.5 seconds or in less than about 0.2 seconds after the isolation valve is opened.

At block 408, a material is formed on the wafer substrate, wherein the gas is used for forming the material. In some implementations, the gas includes a precursor for the material to be formed.

The operations associated with the method 400 shown in FIG. 4A may be applicable to deposition processes employing a longer steady state flow of a gas in which an initial spatially non-uniform flow across the faceplate of a showerhead may result thickness non-uniformities in the deposited material. For example, in the method 400, the gas may include a precursor used in a CVD process.

Figure 4B:
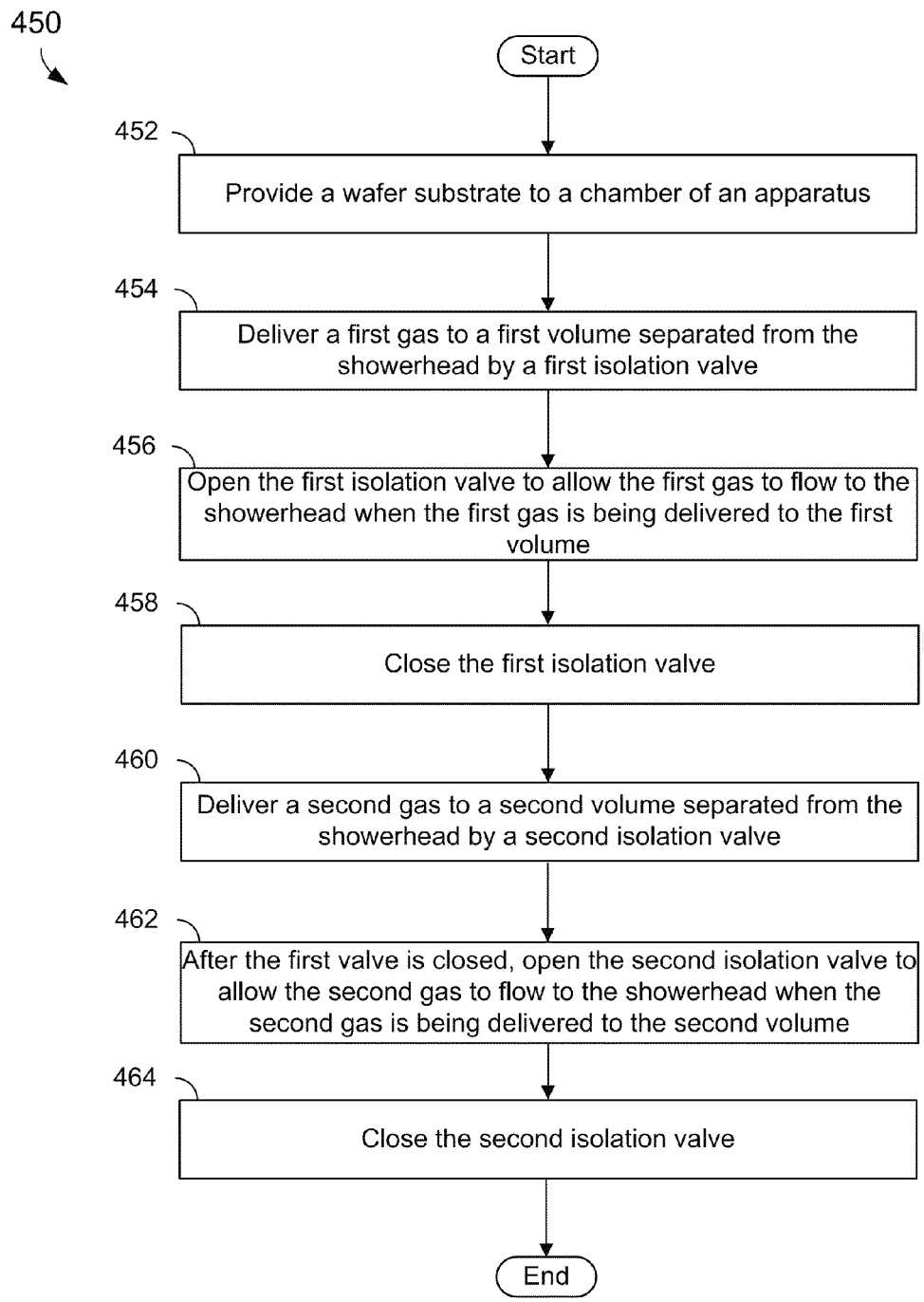

FIG. 4B shows an example of a flow diagram illustrating a process for depositing a material. At block 452 of the method 450, a wafer substrate is provided to a chamber of an apparatus. The apparatus includes a showerhead to deliver a gas to the chamber, a first volume, a first isolation valve between the first volume and the showerhead, a second volume, and a second isolation valve between the second volume and the showerhead.

In some implementations, the showerhead includes an inlet for the gasses, a faceplate having a plurality of holes, and an area into which the gasses travel from the inlet to the plurality of holes. This area may be referred to as a plenum.

In some implementations, the apparatus may further include a flow control device. For example, the flow control device may receive a gas from a gas source and deliver the gas to the volume. In some implementations, the flow control device may include a mass flow controller. The mass flow controller may include a flow measurement sensor and a proportional control valve. In some implementations, the apparatus may include a first flow control device for delivering the first gas and a second flow control device for delivering the second gas.

At block 454, a first gas is delivered to the first volume separated from the showerhead by the first isolation valve. In some implementations, the first volume may be separated from the showerhead when the first isolation valve is closed. In some implementations, delivering the first gas to the first volume when the first isolation valve is closed pressurizes the first volume behind the first isolation valve. In some implementations, the first gas does not flow to the showerhead when the first isolation valve is closed. In some implementations, delivering the first gas to first volume is continuous once the delivery begins; delivering the first gas to the first volume may stop at the end of the process.

At block 456, the first isolation valve is opened to allow the first gas to flow to the showerhead when the first gas is being delivered to the first volume. In some implementations, a pressure in the first volume is about 100 to 200 Torr before the first isolation valve is opened. In other implementations, the ratio of a pressure in the first volume to the pressure in the chamber is about 2:1 before the first isolation valve is opened. In some implementations, the first isolation valve may be opened for a duration of 0.5 seconds or less than about 0.5 seconds.

The pressurized volume of the first gas that flows to the showerhead reduces the spatially non-uniform flow from the showerhead faceplate, in some implementations. In some implementations, a substantially spatially uniform flow of the first gas across the faceplate of the showerhead is achieved. In some implementations, such a substantially spatially uniform flow of the first gas across the faceplate of the showerhead is achieved in less than about 0.5 seconds or in less than about 0.2 seconds after the first isolation valve is opened.

At block 458, the first isolation valve is closed. This stops the flow of the first gas to the showerhead. In some implementations, the first gas is still delivered to the first volume after the first isolation valve is closed, pressurizing the first volume.

At block 460, a second gas is delivered to the second volume separated from the showerhead by the second isolation valve. In some implementations, the second volume may be separated from the showerhead when the second isolation valve is closed. In some implementations, delivering the second gas to the second volume when the second isolation valve is closed pressurizes the second volume behind the second isolation valve. In some implementations, the second gas does not flow to the showerhead when the second isolation valve is closed. In some implementations, delivering the second gas to second volume is continuous once the delivery begins; delivering the second gas to the second volume may stop at the end of the process. In some implementations, the operation in block 460 may be performed when the operations in blocks 454 through 458 are being performed.

At block 462, after the first isolation valve is closed, the second isolation valve is opened to allow the second gas to flow to the showerhead when the second gas is being delivered to the second volume. In some implementations, a pressure in the second volume is about 100 to 200 Torr before the second isolation valve is opened. In other implementations, the ratio of a pressure in the second volume to the pressure in the chamber is about 2:1 before the second isolation valve is opened. In some implementations, the second isolation valve may be opened for a duration of 0.5 seconds or less than about 0.5 seconds.

The pressurized volume of the second gas that flows to the showerhead reduces the spatially non-uniform flow from the showerhead faceplate, in some implementations. In some implementations, a substantially spatially uniform flow of the second gas across the faceplate of the showerhead is achieved. In some implementations, such a substantially spatially uniform flow of the second gas across the faceplate of the showerhead is achieved in less than about 0.5 seconds or in less than about 0.2 seconds after the second isolation valve is opened.

In some implementations, block 462 may include further process operations. For example, the second gas may be allowed to flow to the showerhead for a first period of time to purge the chamber of the first gas. In some implementations, this first period of time may be about 0.5 seconds or less than about 0.5 seconds. Then, the second gas may be allowed to continue to flow to the showerhead for a second period of time. During this second period of time, a plasma may be formed with the second gas, with species generated in the plasma reacting with the first gas adsorbed to a surface of the wafer substrate to form a material on the wafer substrate. In some implementations, this second period of time may be about 0.5 seconds or less than about 0.5 seconds. The second gas may be allowed to continue to flow to the showerhead for a third period of time to purge the chamber. In some implementations, this third period of time may be about 0.5 seconds or less about than 0.5 seconds. Thus, in some implementations, the second isolation valve may be opened for a duration of about 1.5 seconds or less than about 1.5 seconds.

At block 464, the second isolation valve is closed. This stops the flow of the second gas to the showerhead. In some implementations, the second gas is still delivered to the second volume after the second isolation valve is closed, pressurizing the second volume.

The operations associated with the method 450 shown in FIG. 4B may be applicable to deposition processes employing cyclic short duration flows of gasses. For example, in the method 450, the first gas and the second gas may include precursors used in an ALD process. The first gas and second gas may be admitted to the chamber to form a material on a wafer substrate via a reaction at a surface of the wafer substrate. In some implementations, the operations at block 454 through block 464 may be repeated until a desired thickness of the material is attained.

The method 450 shown in FIG. 4B may further include purge operations in which the first gas and the second gas are removed from the chamber by a flow of a third gas into the chamber. The first gas that is adsorbed to a surface of the wafer substrate may remain in the chamber after the purge operation, in some implementations. For example, purge operations may occur after block 458 and after block 464, in some implementations.

Implementations of the apparatus and methods disclosed herein may be used to deposit a wide variety of different materials. For example, metals employed in integrated circuit devices may be deposited, including tantalum (Ta), ruthenium (Ru), copper (Cu), cobalt (Co), and nickel (Ni). Insulating materials employed in integrated circuit devices may be deposited, including silicon dioxide ($SiO_2$), silica, doped silica, silicate glasses, and doped silicate glasses; dopants for the doped silica and the doped silicate glasses may include boron (B), phosphorus (P), and arsenic (As). Semiconductor materials may be deposited, including silicon (Si) and III-V semiconductor materials, including gallium arsenide (GaAs). Barrier films employed in integrated circuit devices may be deposited, including tantalum nitride (TaN), tantalum carbonitride (TaCN), and silicon nitride (SiN). One having ordinary skill in the art will recognize that the methods disclosed herein are applicable to a broad range of materials and processes.

Further, the integrated circuit devices that may be fabricated using implementations of the apparatus and methods disclosed herein include integrated circuits for use in computing devices and optoelectronics, including light emitting diodes (LEDs), for example.

In some implementations, the methods described herein improve the film thickness uniformity. In some implementations, pressuring a volume with a gas that is to be admitted to the chamber through a showerhead may be performed during other operations in a cyclic deposition process.

Certain aspects of the methods described herein are described in U.S. Pat. No. 7,141,494 and U.S. Pat. No. 7,005,372, both of which are herein incorporated by reference. Implementations disclosed herein may be employed with substrates having features of any size, including substrates at the 32 nm technology node and future nodes beyond that. At such technology nodes, deposition processes able to deposit highly conformal films are needed.

Experimental

In some implementations, the disclosed methods improve the thickness non-uniformity of a material that is deposited to less than about 5%. In some implementations, the disclosed methods improve the growth rate for an iALD deposited material by at least about 20%, which improves the throughput for an iALD apparatus by at least about 10%.

Figure 5:
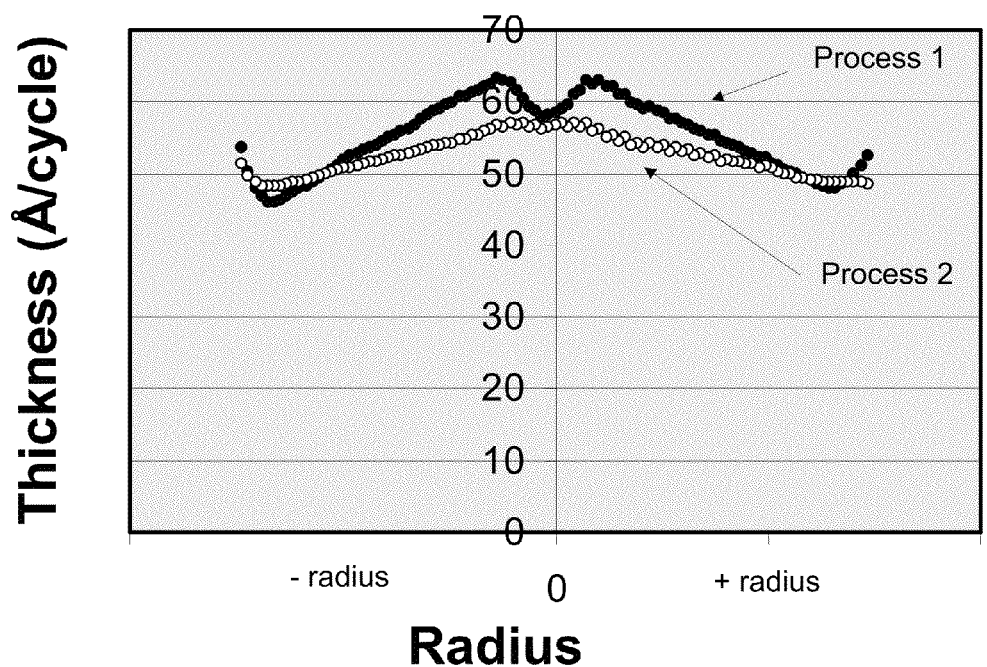
FIG. 5 shows a plot illustrating TaN thickness across the diameter of a wafer substrate.
Figure 6:
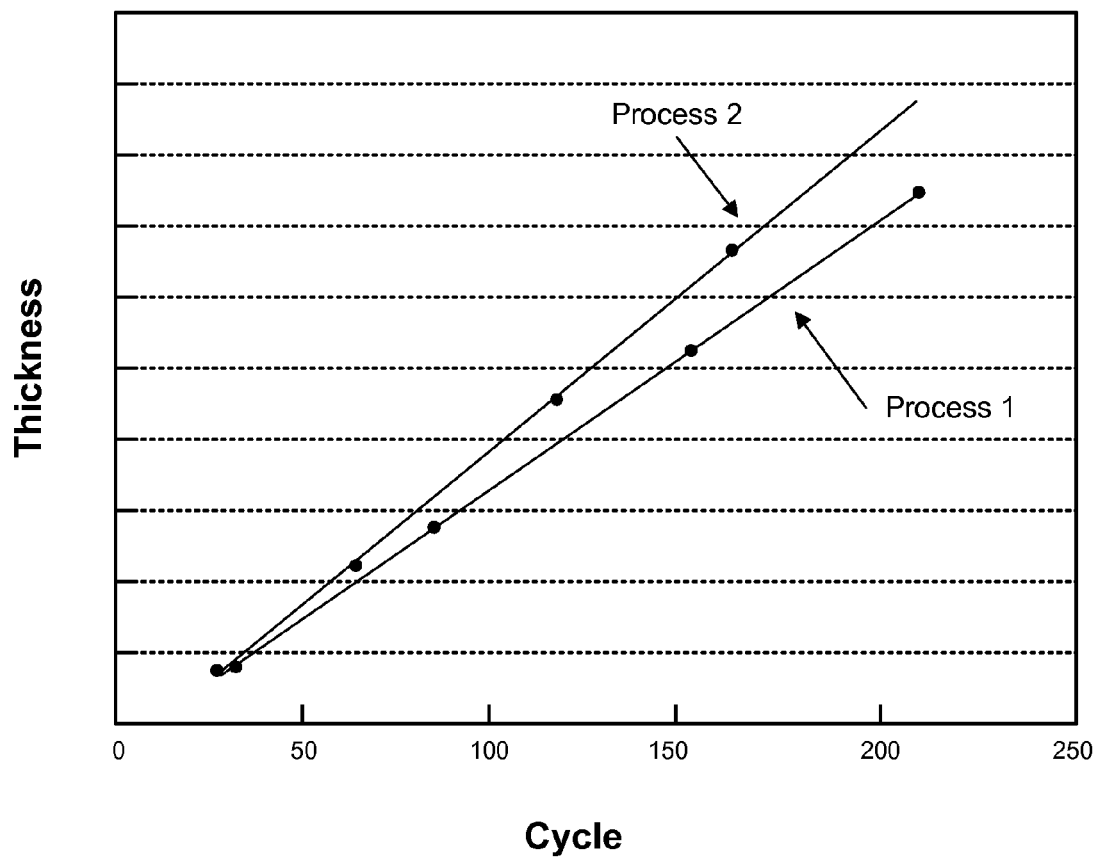
FIG. 6 shows a plot illustrating TaN growth rate versus process cycle.

FIGS. 5 and 6 show the results of TaN deposition using two different deposition processes. In both processes, the TaN was deposited with a cyclic iALD process using tert-butylimino tris(diethylamino) tantalum (TBTDET) for the tantalum precursor. In process 1, the process operations included a 0.5 second flow of the precursor, a 0.5 second $Ar/H_2$ purge, a 2 second generation of an $Ar/H_2$ plasma, and a 0.1 second $Ar/H_2$ purge. In process 1, a pressurized volume of the precursor gas was not used to decrease the duration of the spatially non-uniform flow from the showerhead faceplate. Process 2 was similar to process 1, but in process 2, a pressurized volume of the precursor gas was used to decrease the duration of the spatially non-uniform flow from the showerhead faceplate.

FIG. 5 is a plot illustrating TaN thickness across the diameter of a wafer substrate. 0 indicates the center of the wafer substrate. The plot labeled "Process 1" is a thickness line scan of TaN deposited with process 1, showing that the thickness non-uniformity of the TaN is about 9%. The plot labeled "Process 2" is a thickness line scan of TaN deposited with process 2, showing that the thickness non-uniformity of the TaN is about 5%.

FIG. 6 is a plot illustrating TaN growth rate versus process cycle. The plot labeled "Process 1" shows growth rate of TaN deposited with process 1. The plot labeled "Process 2" shows the growth rate of TaN deposited with process 2. An about 20% higher grow rate of TaN is achieved with process 2 due to decreasing the duration of the spatially non-uniform flow from the showerhead faceplate.

Further Embodiments

The apparatus and methods described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically comprises some or all of the following steps, each step enabled with a number of possible tools: (1) application of photoresist on a work piece, i.e., substrate, using a spin-on or spray-on tool; (2) curing of photoresist using a hot plate, furnace, or UV curing tool; (3) exposing the photoresist to visible, UV, or x-ray light with a tool such as a wafer stepper; (4) developing the resist so as to selectively remove resist and thereby pattern it using a tool such as a wet bench; (5) transferring the resist pattern into an underlying film or work piece by using a dry or plasma-assisted etching tool; and (6) removing the resist using a tool such as an RF or microwave plasma resist stripper.

Further, the apparatus and methods described herein are not limited to the delivery of gasses for deposition of a material. For example, the apparatus and methods describe herein extend to the delivery of other process gasses, such as the gasses employed in other processing operations, such as etching operations, for example. In such instances, the gasses used in the processing operation may be pressurized in a delivery line while other operations occur.

It should also be noted that there are many alternative ways of implementing the disclosed methods and apparatuses. It is therefore intended that the following appended claims be interpreted as including all such alterations, modifications, permutations, and substitute equivalents as fall within the true spirit and scope of implementations of the present invention.

What is claimed is:

1. A method comprising:
   providing a wafer substrate to a chamber of an apparatus, the apparatus including a showerhead to deliver a gas to the chamber, a volume, and an isolation valve between the volume and the showerhead, wherein the showerhead includes a gas inlet coupled to the isolation valve at an inlet end of the showerhead and a faceplate at an outlet end of the showerhead;
   delivering the gas to the volume when the isolation valve is closed to pressurize the volume with the gas, wherein a ratio of a pressure in the volume to a pressure in the chamber is equal to or greater than about 2:1 before opening the isolation valve;
   opening the isolation valve to allow the gas to flow to the showerhead simultaneous with the gas being continuously delivered to the volume, wherein a substantially spatially uniform flow of the gas across the faceplate of the showerhead is achieved in less than about 0.5 seconds after opening the isolation valve; and
   forming a material on the wafer substrate, wherein the gas is used for forming the material.

2. The method of claim 1, wherein the apparatus further includes a flow control device, and wherein the flow control device delivers the gas to the volume.

3. The method of claim 2, wherein the flow control device includes a mass flow controller having a flow measurement sensor and a proportional control valve.

4. The method of claim 1, wherein the gas does not flow to the showerhead when the isolation valve is closed.

5. The method of claim 1, wherein the apparatus further includes a flow control device to deliver the gas to the volume, and wherein the flow control device remains open when delivering the gas continuously to the volume.

6. The method of claim 1, wherein the gas includes a precursor for the material to be formed.

7. The method of claim 1, wherein the showerhead includes an inlet for the gas, a faceplate having a plurality of holes, and a region into which the gas travels from the inlet to the plurality of holes.

8. The method of claim 7, wherein the region of the showerhead into which the gas travels from the inlet to the plurality of holes has a volume of about 89 to 4500 milliliters.

9. The method of claim 1, wherein a pressure in the volume is about 100 to 200 Torr before opening the isolation valve.

10. The method of claim 1, further comprising:
    applying a photoresist to the wafer substrate;
    exposing the photoresist to light;
    patterning the photoresist and transferring the pattern to the wafer substrate; and
    selectively removing the photoresist from the wafer substrate.

11. A method comprising:
    (a) providing a wafer substrate to a chamber of an apparatus, the apparatus including a showerhead to deliver a first gas and a second gas to the chamber, a first volume, a first isolation valve between the first volume and the showerhead, a second volume, and a second isolation valve between the second volume to the showerhead;
    (b) delivering the first gas to the first volume when the first isolation valve is closed to pressurize the first volume with the first gas, wherein a ratio of a pressure in the first volume to a pressure in the chamber is equal to or greater than about 2:1 before opening the first isolation valve;
    (c) opening the first isolation valve to allow the first gas to flow to the showerhead simultaneous with the first gas being continuously delivered to the first volume, wherein a substantially spatially uniform flow of the first gas across a faceplate of the showerhead is achieved in less than about 0.5 seconds after opening the first isolation valve;
    (d) closing the first isolation valve;
    (e) delivering the second gas to the second volume when the second isolation valve is closed to pressurize the second volume with the second gas, wherein a ratio of a pressure in the second volume to a pressure in the chamber is equal to or greater than about 2:1 before opening the second isolation valve;
    (f) after closing the first isolation valve, opening the second isolation valve to allow the second gas to flow to the showerhead simultaneous with the second gas being continuously delivered to the second volume, wherein a substantially spatially uniform flow of the second gas across the faceplate of the showerhead is achieved in less than about 0.5 seconds after opening the second isolation valve; and
    (g) closing the second isolation valve.

12. The method of claim 11, further comprising:
    (h) repeating operations (b) though (g) to form a material on the wafer substrate, wherein the first gas and the second gas react at a surface of the wafer substrate to form the material.

13. The method of claim 11, further comprising:
    forming a material on the wafer substrate, wherein the first gas and the second gas react at a surface of the wafer substrate to form the material.

14. The method of claim 11, wherein operation (f) includes:
    allowing the second gas to flow to the showerhead for a first period of time to purge the chamber of the first gas;
    allowing the second gas to flow to the showerhead for a second period of time, wherein during the second period of time a plasma is formed with the second gas, and wherein plasma species in the plasma react with the first gas adsorbed to a surface of the wafer substrate to form a material on the wafer substrate; and
    allowing the second gas to flow to the showerhead for a third period of time to purge the chamber.

15. The method of claim 11, further comprising:
    purging the chamber using a third gas after operations (d) and (g).

16. The method of claim 11, wherein the first isolation valve is opened for a duration of less than about 0.5 seconds and wherein the second isolation valve is opened for a duration of less than about 1.5 seconds.

17. An apparatus for forming a material, comprising:
    a process chamber including a showerhead;
    a volume configured to contain a gas;
    an isolation valve between the volume and the showerhead, wherein the showerhead includes a gas inlet coupled to the isolation valve at an inlet end of the showerhead and a faceplate at an outlet end of the showerhead; and a controller configured to provide program instructions for conducting a process including:

delivering the gas to the volume when the isolation valve is closed to pressurize the volume with the gas, wherein a ratio of a pressure in the volume to a pressure in the process chamber is equal to or greater than about 2:1 before opening the isolation valve;

opening the isolation valve to allow the gas to flow to the showerhead simultaneous with the gas being continuously delivered to the volume, wherein a substantially spatially uniform flow of the gas across the faceplate of the showerhead is achieved in less than about 0.5 seconds after opening the isolation valve; and forming a material on a wafer substrate contained within the chamber, wherein the gas is used for forming the material.

18. A system comprising the apparatus of claim 17 and a stepper.

19. A non-transitory computer machine-readable medium including program instructions for control of an apparatus, the apparatus including a chamber, a showerhead to deliver a gas to the chamber, a volume, and an isolation valve between the volume and the showerhead, wherein the showerhead includes a gas inlet coupled to the isolation valve at an inlet end of the showerhead and a faceplate at an outlet end of the showerhead, the program instructions including code for operations comprising:

delivering the gas to the volume when the isolation valve is closed to pressurize the volume with the gas, wherein a ratio of a pressure in the volume to a pressure in the chamber is equal to or greater than about 2:1 before opening the isolation valve;

opening the isolation valve to allow the gas to flow to the showerhead simultaneous with the gas being delivered continuously to the volume, wherein a substantially spatially uniform flow of the gas across the faceplate of the showerhead is achieved in less than about 0.5 seconds after opening the isolation valve; and forming a material on a wafer substrate contained within the chamber, wherein the gas is used for forming the material.

\* \* \* \* \*